United States Patent
Kennedy et al.

(10) Patent No.: US 6,304,141 B1
(45) Date of Patent: Oct. 16, 2001

(54) COMPLEMENTARY INPUT SELF-BIASED DIFFERENTIAL AMPLIFIER WITH GAIN COMPENSATION

(75) Inventors: Joseph T. Kennedy; Stephen R. Mooney, both of Beaverton; Aaron K. Martin; Rajendran Nair, both of Hillsboro, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/609,495

(22) Filed: Jun. 30, 2000

(51) Int. Cl.$^7$ ........................................................ H03F 3/45
(52) U.S. Cl. .......................................... 330/253; 330/261
(58) Field of Search ..................................... 330/253, 261

(56) References Cited

U.S. PATENT DOCUMENTS

| | | | |
|---|---|---|---|
| 4,797,631 | * 1/1989 | Hsu et al. | 330/253 |
| 4,958,133 | 9/1990 | Bazes | 330/253 |
| 5,515,003 | * 5/1996 | Kimura | 330/253 |
| 5,602,509 | * 2/1997 | Kimura | 330/253 |
| 6,137,360 | * 10/2000 | Memida | 330/253 |

OTHER PUBLICATIONS

IEEEJournal of Solid State Circuits, Compact Low–Voltage Power–Efficient Operational Amplifier Cells for VLSI, Oct. 1998.*

Coban, A.L., et al., "A 1.75V rail–to–rail CMOS op amp", *1994 IEEE International Symposium on Circuits and Systems*, vol. 5 of 6, 497–500, (1994).

de Langen, K., et al., "Compact Low–Voltage Power–Efficient Operational Amplifier Cells for VLSI", *IEEE Journal of Solid–State Circuits*, vol. 33, 1482–1496, (Oct. 1998).

Sakurai, S., et al., "Robust Design of Rail–to–Rail CMOS Operational Amplifiers for a Low Power Supply Voltage", *IEEE Journal of Solid–State Circuits*, vol. 31, 146–156, (Feb. 1996).

* cited by examiner

*Primary Examiner*—Robert Pascal
*Assistant Examiner*—Henry Choe
(74) *Attorney, Agent, or Firm*—Schwegman, Lundberg, Woessner & Kluth, P.A.

(57) ABSTRACT

A complementary input self-biased differential amplifier includes gain compensation devices. The gain compensation devices are in parallel with input transistors and are biased by a self-bias node. The gain control devices serve to keep current flowing in load devices when operating at common-mode extremes, thereby limiting the reduction in amplifier output impedance and limiting the corresponding reduction in differential-mode gain at common-mode extremes. The gain control devices also serve to reduce input stage transconductance near the center of the common-mode input voltage swing, thereby reducing differential-mode gain near the center of the swing, and reducing gain variations across the input common-mode range. The differential amplifier can include multiple input legs on either side of an input stage. Multiple legs allow multiple reference voltages to be compared to a data signal. A bidirectional data link utilizes the multiple reference inputs to remove an ambiguity created by the bidirectional data link.

20 Claims, 6 Drawing Sheets

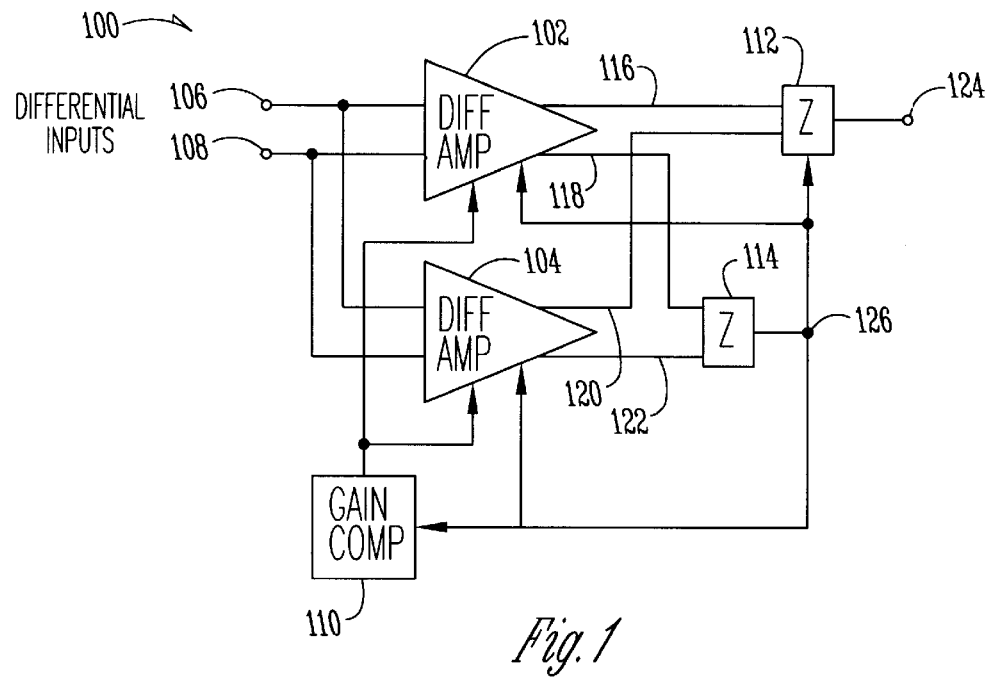
Fig. 1
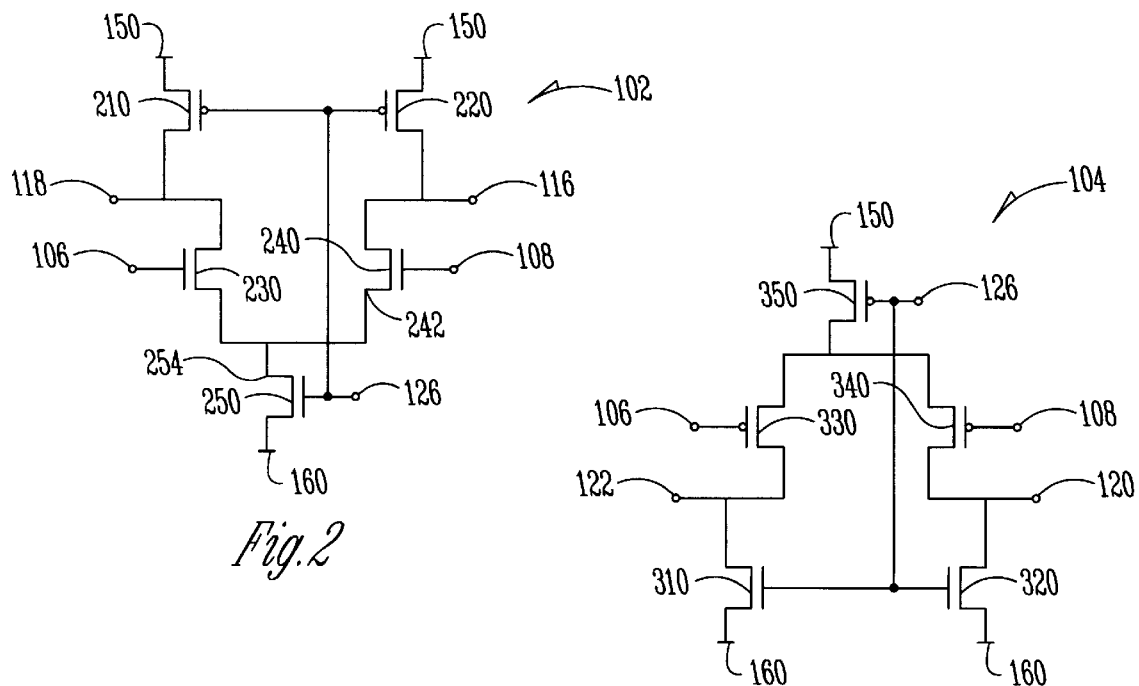
Fig. 2
Fig. 3

COMPLEMENTARY INPUT SELF-BIASED DIFFERENTIAL AMPLIFIER WITH GAIN COMPENSATION

FIELD

The present invention relates generally to differential amplifiers, and more specifically to differential amplifiers with gain compensation.

BACKGROUND OF THE INVENTION

Differential amplifiers typically amplify the difference between two input signals. Differential-mode gain measures the amount of amplification of the difference between the two input signals, and is typically very high. In an ideal differential amplifier, differential-mode gain is constant as the two input signals move up and down in voltage together (known as the "common-mode input voltage"). When the differential-mode gain varies as the input common-mode voltage changes, the output signal may exhibit timing variation, or "jitter."

Typical differential amplifiers include a pair of input transistors that switch current from one load to another. As the input common-mode voltage approaches a voltage rail, differential-mode gain tends to drop. U.S. Pat. No. 4,958,133 issued Sep. 18, 1990 describes a complementary self-biased differential amplifier that includes two complementary differential amplifiers combined to provide a rail-to-rail common-mode input voltage range. Each of the differential amplifiers continues to operate near one voltage rail when the other differential amplifier tends to turn off. This results in the differential-mode gain that drops to approximately ½ of its maximum value when the common-mode input voltage is near either voltage rail. There is also a corresponding decrease in amplifier output impedance near either voltage rail. The varying differential-mode gain across the common-mode input voltage range can cause jitter.

For the reasons stated above, and for other reasons stated below which will become apparent to those skilled in the art upon reading and understanding the present specification, there is a need in the art for a differential amplifier with reduced differential gain variation across a wide common-mode input voltage range.

BRIEF DESCRIPTION OF THE DRAWINGS

FIG. 1 shows a differential amplifier circuit with gain compensation devices;

FIG. 2 shows a differential amplifier with an N-channel input transistor pair;

FIG. 3 shows a differential amplifier with a P-channel input transistor pair;

DESCRIPTION OF EMBODIMENTS

Figure 4A:
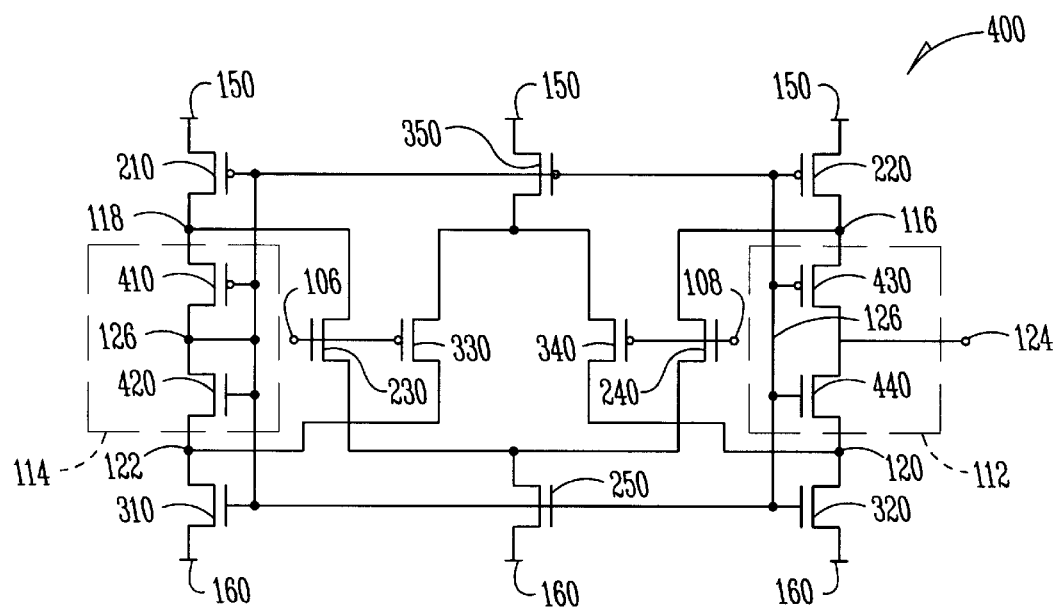
FIGS. 4A and 4B show a folded cascode differential amplifier and a gain curve therefor.

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism to compensate for amplifier gain variations over a wide common-mode input voltage range. In a self-biased differential amplifier that includes a complementary differential input stage, gain compensating transistors are included in parallel with input transistors. The gain compensating transistors serve to keep current flowing in load transistors, resulting in less gain loss at common-mode input voltage extremes. The gain compensating transistors also serve to reduce input stage transconductance by routing current around the input stage, thereby reducing gain in the middle of the common-mode input voltage range. Differential-mode gain is increased at the common-mode extremes, and is decreased at the common-mode center, resulting in less differential-mode gain variation across the the common-mode input voltage range. The gain compensating transistors are biased using a voltage present on a self-bias node generated by the differential amplifier.

FIG. 1 shows a differential amplifier circuit with gain compensation devices. Differential amplifier circuit 100 receives signals on input nodes 106 and 108 that together make a differential input node. Differential amplifier circuit 100 produces an output signal on output node 124. Differential amplifier circuit 100 includes differential amplifiers 102 and 104, gain compensation devices 110, and cascode devices 112 and 114. Differential amplifier 102 receives signals on input nodes 106 and 108, and produces differential output signals on nodes 116 and 118. Differential amplifier 104 receives input signals on nodes 106 and 108, and produces differential output signals on nodes 120 and 122.

The embodiment shown in FIG. 1 utilizes two complementary differential amplifiers in parallel to operate with a common-mode input voltage close to either voltage rail. When one differential amplifier begins to shut off as the common-mode input voltage approaches one voltage rail, the other differential amplifier continues to operate. As a result, differential amplifier circuit 100 continues to operate as the common-mode input approaches either voltage rail.

Gain compensation devices 110 provide compensation for differential amplifiers 102 and 104. For example, when the transconductance of differential amplifier 102 begins to drop as a result of the common-mode input voltage approaching one voltage rail, gain compensation devices 110 mitigate the associated decrease in gain by keeping current flowing in output transistors within differential amplifier 102. When current continues to flow in the output devices, reductions in output impedance are limited, and gain does not drop as far as it otherwise would. Likewise, as the common-mode input voltage approaches the other rail, gain compensation devices 110 compensate by limiting reductions in the output impedance of differential amplifier 104.

Cascode devices 112 and 114 increase the output impedance of differential amplifier circuit 100. The gain of an amplifier can be expressed by the mathematical product of the transconductance and the output impedance of the amplifier. Cascode devices 112 and 114 increase the output impedance of differential amplifier circuit 100, thereby increasing gain. In the embodiment of FIG. 1, node 126 is not used as part of a differential output, but rather is fed back into differential amplifier circuit 100 to be used as a self-bias node. As shown in FIG. 1, self-bias node 126 provides a self-bias to differential amplifiers 102 and 104, gain compensation devices 110, and cascode device 112.

Cascode device 112 receives a signal on node 116 from differential amplifier 102, and also receives a signal on node 120 from differential amplifier 104. From these two differential amplifier output signals, cascode device 112 produces an output signal for differential amplifier circuit 100 on output node 124. In a like manner, cascode device 114 receives a signal on node 118 from differential amplifier 102 and also receives a signal from differential amplifier 104 on node 122. From these two differential amplifier output signals, cascode device 114 produces the self-biasing signal on self-bias node 126.

Self-bias node 126 provides a bias voltage to various circuit elements in differential amplifier circuit 100. Rather than provide a static voltage value as a bias, self-bias node 126 is part of a feedback network that produces a self-bias voltage as a function of amplifier outputs. For example, cascode device 114 produces the self-bias voltage as a function of differential amplifier outputs 118 and 122. The resulting bias signal is used to bias portions of differential amplifier 102 and differential amplifier 104. In addition, the self-bias voltage on self-bias node 126 is utilized to bias portions of gain compensation devices 110. The various circuit elements shown in FIG. 1 are discussed with reference to the remaining figures.

FIG. 2 shows a differential amplifier having an N-channel transistor input pair. Differential amplifier 102 includes N-channel transistors 230 and 240, P-channel transistors 210 and 220, and N-channel transistor 250 acting as a current source. N-channel transistors 230 and 240 form the differential input pair.

Transistors 210 and 220 form a pair of P-channel load transistors. P-channel transistors 210 and 220, and N-channel transistor 250 have bias input nodes coupled to self-bias node 126. Current provided by N-channel transistor 250 is substantially constant, and is switched between P-channel load transistors 210 and 220 as a function of signals on input node 106 and 108. For example, if the voltage on input node 106 is higher than the voltage on input node 108, a larger percentage of the current from transistor 250 travels through transistor 230 than transistor 240. As a result, more current flows through load transistor 210 than through load transistor 220, and this is reflected as a differential output voltage on output nodes 116 and 118.

The N-channel differential input transistor stage that includes transistors 230 and 240 is coupled between the P-channel load transistors and a current source that includes transistor 250. P-channel load transistors 210 and 220 are coupled between high voltage rail 150 and the input transistor stage that includes transistors 230 and 240. Output nodes 116 and 118 are formed at the junctions between input transistors and load transistors. For example, output node 116 is formed at the junction between P-channel load transistor 220 and N-channel input transistor 240. Likewise, output node 118 is formed at the junction between P-channel load transistor 210 and N-channel input transistor 230.

Source 242 of transistor 240 is coupled to drain 254 of transistor 250. Transistor 240 will be on, at least slightly, when the gate-to-source voltage (Vgs) exceeds a threshold voltage (Vt). When the common-mode input voltage on input nodes 106 and 108 is approximately halfway between voltage rail 150 and voltage rail 160, Vgs for both transistors 230 and 240 is sufficiently high to exceed Vt. As the input common-mode voltage drops, the average Vgs imposed on input transistors 230 and 240 also drops. If transistor 250 is saturated, then when the gate voltage on transistor 240 drops to a level near the sum of the saturation voltage of transistor 250 and the threshold voltage of transistor 240, transistor 240 begins to shut off. Before the input common-mode voltage reaches the negative rail 160, input transistors 106 and 108 are off, and differential amplifier 102 ceases to provide differential-mode gain.

As the voltage on input transistors 230 and 240 drops, the transconductance drops and the drain-to-source current therethrough also drops. The transconductance drops because the output current change is less for any given input voltage change, and the drain-to-source current drops because Vgs drops. The reduced current in the input transistors results in reduced currents in load transistors 210 and 220, which in turn results in a reduced output impedance.

As previously stated, the differential voltage gain can be viewed as the mathematical product of the transconductance of the amplifier and the output impedance of the amplifier. Transconductance is a measure of output current change as input voltage changes. For example, when the input voltage on input node 108 increases, the drain current on transistor 240 also increases. If the current change is large for a small voltage change, then the transconductance is large. If the current change is small for the same voltage change, then the transconductance is not as large. The current flows through load transistor 220, and the voltage change seen at output node 116 is the product of the current and the output impedance. If the transconductance drops, then for any given voltage change on input node 108, the change in current drops, and the output voltage change drops. The output voltage change will also drop if the output impedance drops. Because the ratio of output voltage change to input voltage change drops, the gain of the amplifier is lower.

As the input common-mode voltage approaches positive rail 150, differential amplifier 102 continues to operate because P-channel load transistors 210 and 220 are saturated, and input transistors 230 and 240 have a large gate-to-source voltage imposed thereon. It can be seen then, that differential amplifier 102, while continuing to operate with a common-mode input voltage approaching positive rail 150, will experience a decrease in gain as the common-mode input voltage approaches negative rail 160, and below a certain common-mode input voltage, will cease to provide differential-mode gain.

FIG. 3 shows a differential amplifier having a P-channel input transistor pair. Differential amplifier 104 includes P-channel input transistors 330 and 340, N-channel load transistors 310 and 320, and P-channel transistor 350 acting as a current source. Output node 120 is formed at the junction between input transistor 340 and load transistor 320, and output node 122 is formed between input transistor 330 and load transistor 310. P-channel transistor 350 and N-channel load transistors 310 and 320 are biased with a voltage on self-bias node 126.

The operation of differential amplifier 104 is complementary to that of differential amplifier 102. When the common-mode voltage on input nodes 106 and 108 approaches negative voltage rail 160, differential amplifier 104 continues to operate. When the common-mode input voltage approaches positive voltage rail 150, differential amplifier 104 begins to turn off, because the gate-to-source voltages of input transistors 330 and 340 drop below the threshold voltage. As a result, the transconductance of input transistors 330 and 340 drops, and the output impedance drops, causing the differential-mode gain to also drop.

FIG. 4A shows a folded cascode differential amplifier. Differential amplifier circuit 400 shows differential amplifier 102 (FIG. 2) superimposed on differential amplifier 104 (FIG. 3), and also shows cascode devices 112 and 114. P-channel transistor input pair 330 and 340 have inputs coupled to N-channel transistor input pair 106 and 108. Stated differently, the gate of N-channel transistor 230 and the gate of P-channel transistor 330 are both coupled to input node 106. Likewise, the gate of N-channel transistor 240 and the gate of P-channel transistor 340 are both coupled to input node 108.

Differential amplifier 102 produces output signals on output nodes 116 and 118. Node 116 is shown in FIG. 4A as the junction between P-channel load transistor 220 and cascode device 112. Likewise, node 118 is shown as the junction between P-channel load transistor 210 and cascode device 114.

Cascode device 112 includes P-channel transistor 430 and N-channel transistor 440 coupled between output node 116 of differential amplifier 102 and output node 120 of differential amplifier 104. Differential amplifier output node 124 is formed at the junction between P-channel transistor 430 and N-channel transistor 440. P-channel transistor 430 and N-channel transistor 440 are both biased by the voltage on self-bias node 126.

Cascode device 114 is coupled to differential amplifiers 102 and 104 in a substantially similar manner as cascode device 112. P-channel transistor 410 and N-channel transistor 420 are coupled in series between nodes 118 and 122. Self-bias node 126 is formed at the junction between P-channel transistor 410 and N-channel transistor 420. P-channel transistor 410 and N-channel transistor 420 are both biased by the voltage on self-bias node 126.

Differential amplifier 400 is a complementary input self-biased amplifier. As used herein, the term "complementary input" refers to differential input stages of complementary types. For example, differential amplifier 400 includes an N-channel input stage that includes transistors 230 and 240, and also includes a P-channel input stage that includes transistors 330 and 340. The N-channel input stage and the P-channel input stage are of complementary types, hence the term "complementary input."

One can see from the symmetry of differential amplifier circuit 400 that self-bias node 126 would form an output node complementary to output node 124, if not used for self-biasing. Differential amplifier circuit 400 can be viewed, therefore, as having a differential output including nodes 124 and 126, with one of those nodes, node 126, being used as a self-bias node, and the other node, node 124, being used as a single ended output node. The bias voltage present on self-bias node 126 is a feedback signal created by amplifier 400: rather than employing an external bias network, amplifier 400 creates a bias signal using internal feedback.

As discussed with reference to FIGS. 2 and 3 above, as the input common-mode voltage approaches either rail, one of differential amplifiers 102 and 104 begins to shut off, while the other continues to operate. This results in continued operation with a very wide common-mode input voltage range; however, voltage gain decreases when the input common-mode voltage approaches either rail because one of differential amplifiers 102 and 104 begins to shut off, causing transconductance and output impedance to drop. For example, as the input common-mode voltage approaches negative voltage rail 160, the transconductance of N-channel input transistors 230 and 240 decreases, the output impedance of output transistors 210 and 220 decreases, and the differential-mode gain of differential amplifier circuit 400 drops. Likewise, when the input common-mode voltage approaches positive voltage rail 150, the transconductance of P-channel transistors 330 and 340 decreases, the output impedance of output transistors 310 and 320 decreases, and the differential-mode gain of differential amplifier circuit 400 drops.

Figure 4B:
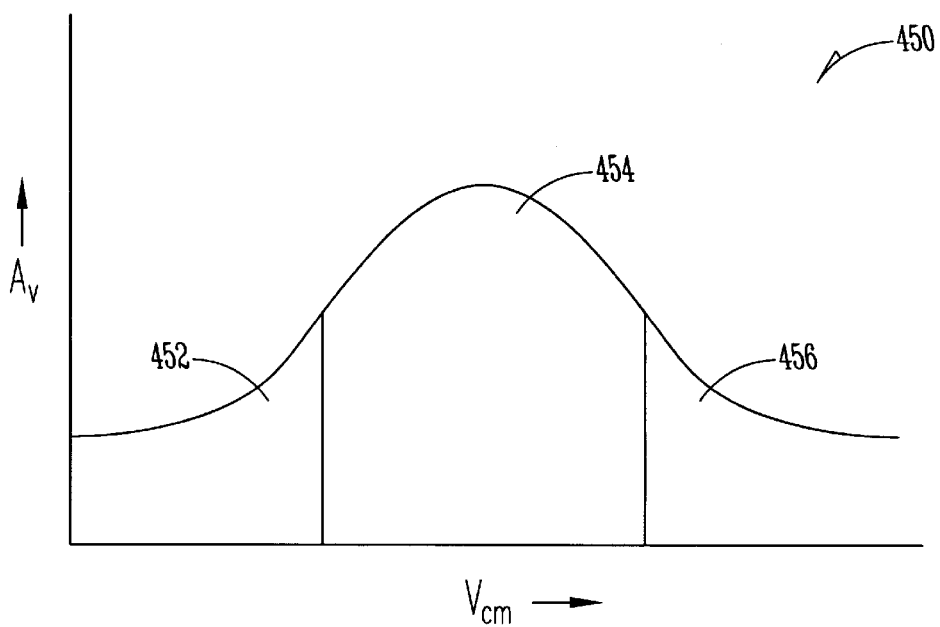

FIG. 4B shows an example gain curve for a differential amplifier such as amplifier 400 (FIG. 4A). Curve 450 plots differential-mode gain (Av) on the vertical axis as a function of common-mode voltage (Vcm) on the horizontal axis. In region 454, the common-mode voltage is near the center of the two rails, and differential-mode gain is high. When the common-mode voltage is near either rail, however, the gain drops. This is shown at regions 452 and 456. The amplitude of gain curve 450 is shown as an example with large differential-mode gain variations over common-mode voltage range. One skilled in the art will understand that larger or smaller differential-mode gain variations can occur.

Figure 5A:
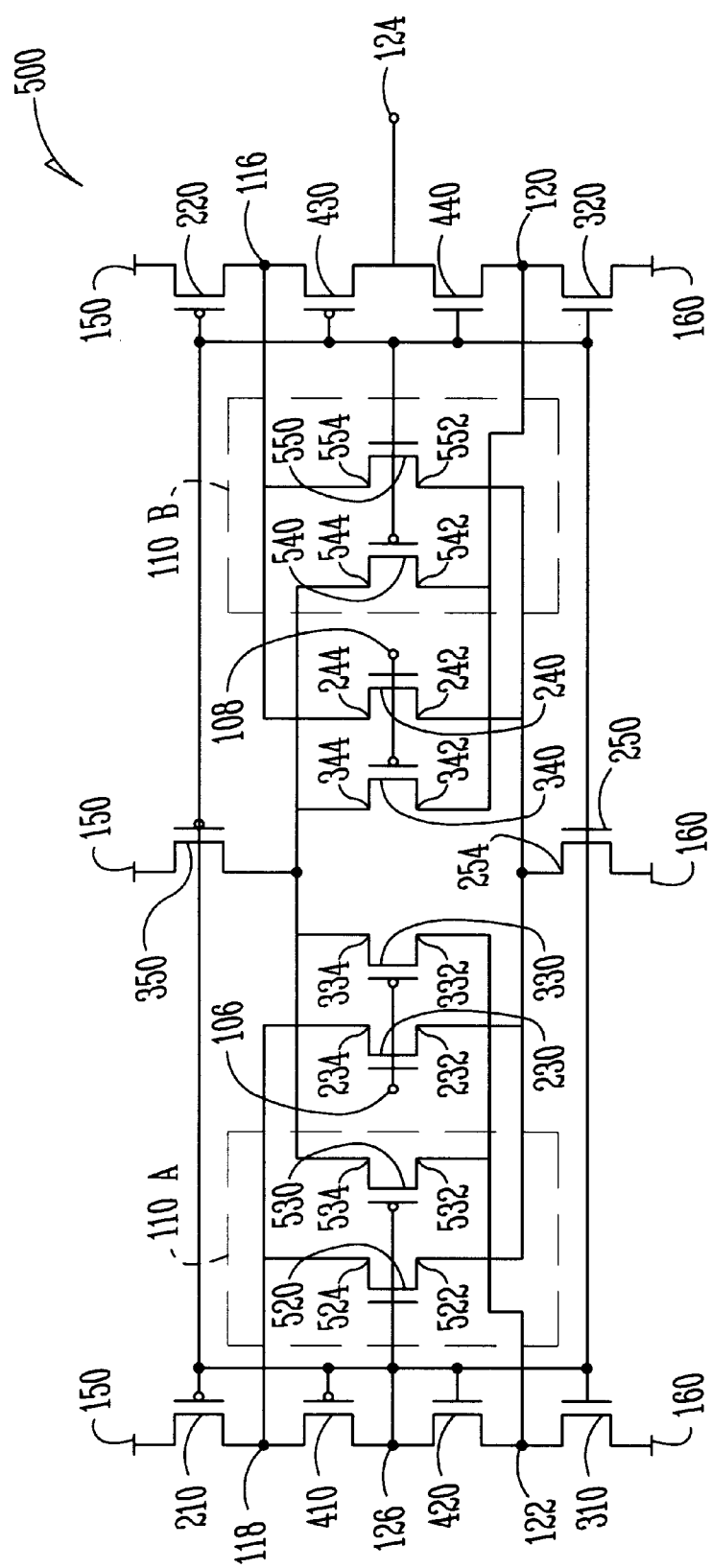
FIGS. 5A and 5B show a folded cascode differential amplifier with gain compensation devices and a gain curve therefor.

FIG. 5A shows a folded cascode amplifier with gain compensation devices. Differential amplifier circuit 500 includes all of the components shown in FIG. 1. Differential amplifiers 102 and 104 are shown superimposed on one another, cascode devices 112 and 114 are shown (as described with reference to FIG. 4A), and gain compensation devices 110 are shown as devices 110_A and 110_B. Gain compensation devices 110_A include N-channel transistor 520 having source 522 and drain 524 in parallel with source 232 and drain 234 of N-channel input transistor 230, and P-channel transistor 530 having source 532 and drain 534 coupled in parallel to source 332 and drain 334 of P-channel input transistor 330. In like fashion, gain compensation devices 110_B include N-channel transistor 550 having source 552 and drain 554 coupled in parallel with source 242 and drain 244 of N-channel input transistor 240, and P-channel transistor 540 having source 542 and drain 544 coupled in parallel with source 342 and drain 344 of P-channel input transistor 340. Transistors 520, 530, 540, and 550 are all biased by the voltage present on self-bias node 126.

In operation, when the common-mode input voltage approaches either rail, pairs of gain compensation transistors compensate for the reduction in gain caused by the decreased transconductance of one of differential amplifiers 102 and 104. For example, as previously described, when the input common-mode voltage approaches negative voltage rail 160, the gate-to-source voltage (Vgs) on input transistors 230 and 240 drops, as does the drain-to-source voltage on transistor 250. As the Vgs on input transistors 230 and 240 decreases, both the transconductance and the drain-to-source currents decrease. The gain compensation devices provide a current path around the input stage so that current flows in the load transistors even when the input stage begins to turn off. By keeping currents flowing in the load transistors, output impedance does not drop as far, and differential-mode gain does not drop as far. The gain compensation transistors also decrease the gain of differential amplifier 500 when the common-mode input voltage is near the center between the two rails. The transconductance of the input stage is lower when the gain compensation devices are present than it would be if they were not present. The result is a flatter gain characteristic across the common-mode voltage range. This is shown in FIG. 5B.

Figure 5B:
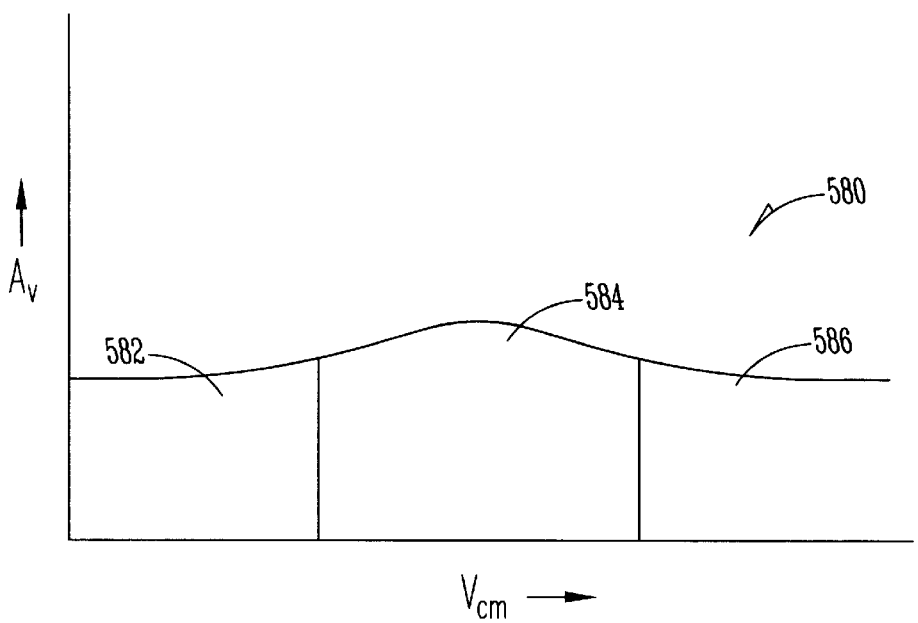

FIG. 5B shows a gain curve of a differential amplifier such as differential amplifier 500 (FIG. 5A). Curve 580 shows differential-mode gain as a function of common-mode input voltage. Regions 582 and 586 show that when the common-mode voltage approaches either rail, the gain compensation devices keep the gain from dropping as far. Region 584 shows that the gain of the amplifier is reduced in the center of the common-mode voltage range. The result is a flatter gain curve having less differential-mode gain variations over the common-mode input voltage range.

Differential amplifier circuit 500 provides a simple, yet effective, biasing mechanism capable of biasing a large number of devices within the circuit. Current source transistors, load transistors, cascode devices, and gain compensating transistors are all effectively biased through the self-biasing feedback mechanism of differential amplifier circuit 500. The circuit is amenable to process and voltage scaling, in part because of symmetry and the lack of special purpose bias circuitry. Through the operation of gain compensation devices, differential amplifier circuit 500 provides more differential-mode gain when the common-mode input voltage approaches either voltage rail 150 or 160, and provides less differential-mode gain in the center of the common-mode voltage swing, thereby providing less overall differential-mode gain variation over the common-mode voltage swing.

Figure 6:
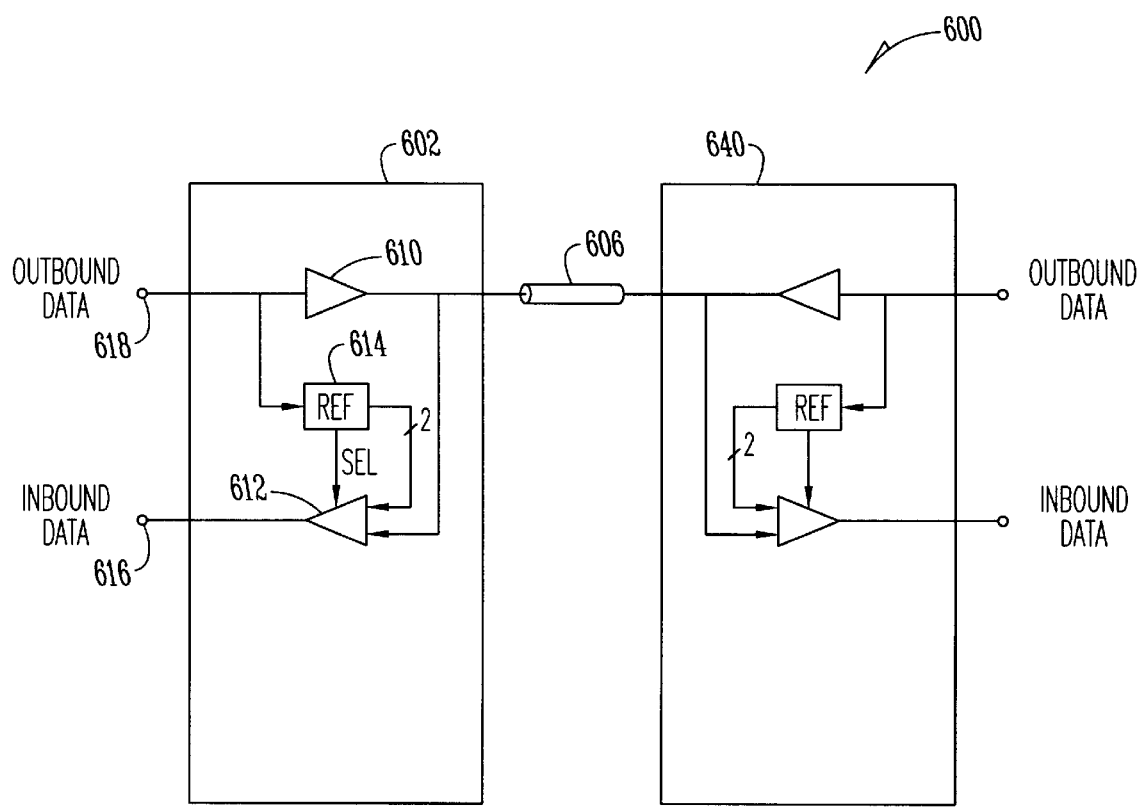
FIG. 6 shows a bidirectional data system.

FIG. 6 shows a bidirectional data system. System 600 includes transceivers 602 and 640, and bidirectional data line 606. Transceiver 602 includes driver 610, receiver 612, and reference circuit 614. Driver 610 drives outbound data onto bidirectional data line 606. Bidirectional data line 606 also has data driven thereon by transceiver 640. Receiver 612 receives the combined signal on bidirectional data line 606 and also receives a reference signal from reference circuit 614.

Receiver 612 includes a differential amplifier with gain compensation. The differential amplifier inputs include a data input node coupled to bidirectional data line 606, multiple reference input nodes, and a select node coupled to an output of reference circuit 614. The reference voltage selected by reference circuit 614 is a function of the outbound data driven onto bidirectional data line 606 by driver 610. Receiver 612 compares the selected reference voltage value to the voltage value on bidirectional data line 606. In this manner, receiver 612 can remove an ambiguity caused by the combination of the outbound data and inbound data on bidirectional data line 606.

For example, if outbound data driven by driver 610 is near the positive voltage rail, and the inbound data driven by circuit 640 is near the negative voltage rail, the voltage value present on bidirectional data line 606 is approximately halfway between the positive and negative voltage rails. Likewise, if outbound data is near the negative voltage rail, and inbound data is near the positive voltage rail, the voltage value present on bidirectional data line 206 is also approximately halfway between the positive and negative voltage rails. An ambiguity arises because the voltage value present on bidirectional data line 606 is substantially the same in both scenarios just described.

The state of the outbound data is used to select which reference voltage value provided by reference circuit 614 is used by receiver 612, and the ambiguity can be removed as a result. For example, when the reference voltage is near the positive voltage rail and the voltage on bidirectional data line 606 is approximately halfway between the positive and negative voltage rails, the inbound data is detected as a zero. Likewise, when the reference voltage is near the negative voltage rail and the voltage on bidirectional data line 606 is approximately halfway between the positive and negative voltage rails, the inbound data is detected as a one.

Figure 7:
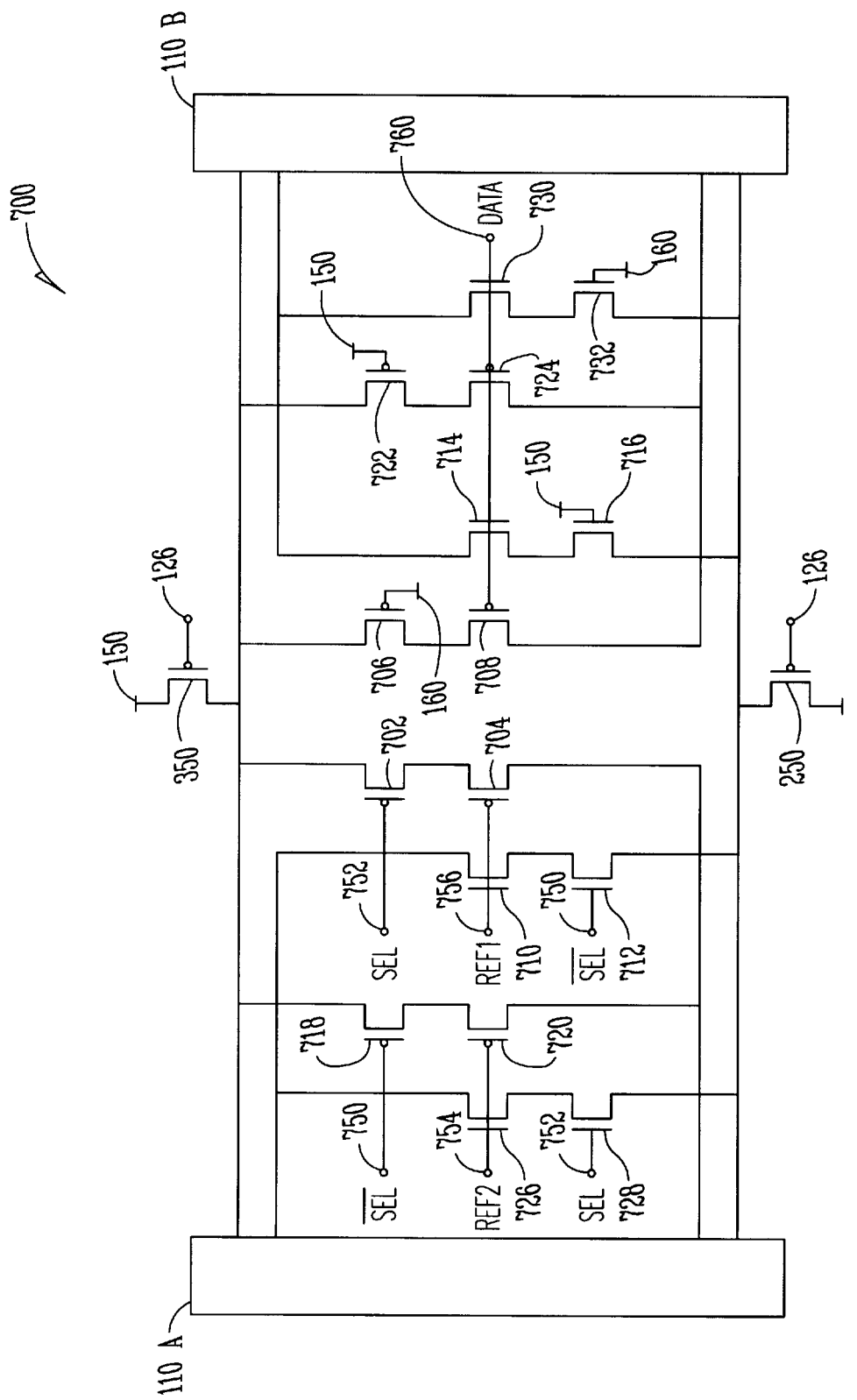
FIG. 7 shows a portion of a data receiver.

FIG. 7 shows a portion of a data receiver. Circuit 700 includes circuitry suitable for inclusion in a data receiver such as receiver 612 (FIG. 6). Shown in FIG. 7 are current source transistors 250 and 350, described above with reference to FIGS. 2–5A, and gain compensation devices 110_A and 110_B (FIG. 5A). Circuit 700 also includes differential amplifier input stages that include input transistors and select transistors. The input stages are configured to accept signals on data input node 760 and reference input nodes 754 and 756. Input transistors 704 and 710 are selected to be part of the input stage when the select signal "SEL" is low. When SEL is low, node 752 is low, and select transistor 702 is on, thereby coupling input transistor 704 into the input stage. Also when SEL is low, the inverse of SEL (referred to as "SEL BAR") on node 750 is high, and select transistor 712 is on, thereby coupling input transistor 710 into the input stage. With input transistors 704 and 710 selected to be part of the input stage, the reference signal on input node 756 is selected as the reference signal to which the data signal on node 760 is compared.

Conversely, when SEL is high and SEL BAR is low, select transistors 718 and 752 are on, and input transistors 726 and 720 are part of the input stage, and the reference signal on node 754 is selected as the reference signal to be compared against the data signal on node 760.

In some embodiments, circuit 700 is made substantially symmetrical by adding "dummy" devices on the other side of the input stage. For example, select transistors 706 and 716 are included in series with input transistors 708 and 714. Select transistor 706 is a P-channel transistor with a gate tied to negative voltage rail 160, and select transistor 716 is an N-channel transistor having a gate tied to positive voltage rail 150. This configuration results in select transistors 706 and 716 always being on, and input transistors 708 and 714 always being part of the input stage. The data signal on node 760 drives the gates of input transistors 708 and 714.

In addition to "dummy" select transistors 706 and 716, in some embodiments, circuit 700 includes a "dummy input leg," shown in FIG. 7 as including transistors 722, 724, 730, and 732. The term "dummy input leg" is used to describe this combination of transistors because select transistors 722 and 732 are configured to always be off, and input transistors 724 and 730 are not used in the data path. The addition of dummy select transistors 706 and 716, and the dummy input leg provide symmetry for loading purposes on other devices, as well as symmetry in integrated circuit layout.

FIG. 7 also shows data input node 760 coupled to gates of input transistors in the "dummy" leg. This increases the capacitive loading on the data input node. In some embodiments, the data input node is not coupled to the gates of dummy input transistors 724 and 730. In these embodiments, the data input node is only coupled to the gates of transistors 708 and 714, and the capacitive loading is lessened.

Figure 8:
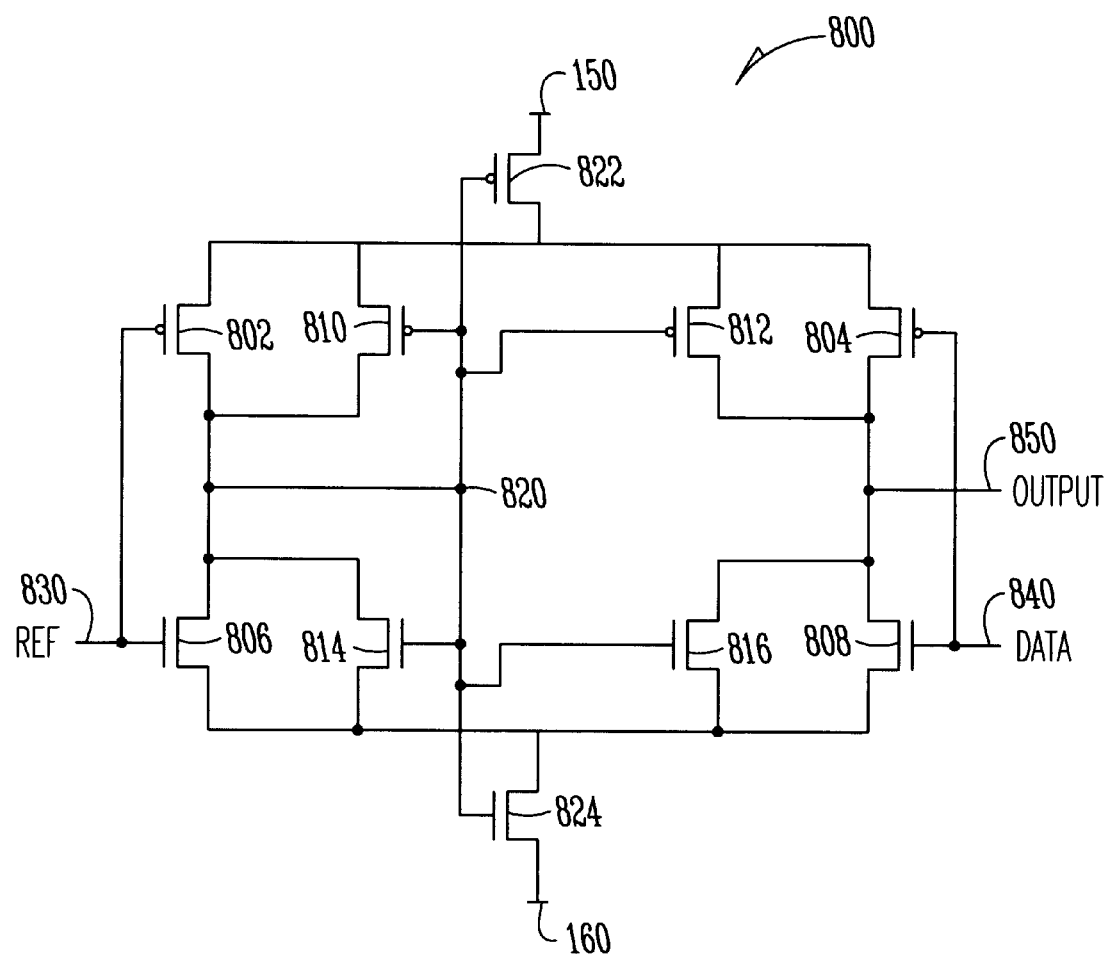
FIG. 8 shows a differential amplifier circuit with gain compensation.

FIG. 8 shows another embodiment of a complementary input self-biased amplifier having gain compensation. Amplifier 800 includes a P-channel differential input stage and an N-channel differential input stage. The P-channel differential input stage includes transistors 802 and 804. The N-channel differential input stage includes transistors 806 and 808. Amplifier 800 receives a differential input on nodes 830 and 840. Node 830 drives transistors 802 and 806, and node 840 drives transistors 804 and 808.

Amplifier 800 includes gain compensation transistors 810, 812, 814, and 816. Each of the gain compensation transistors is coupled in parallel with an input transistor, and is biased by a voltage on self-bias node 820. Self-bias node 820 is a node having a voltage imposed thereon by the action of amplifier 800 rather than by an external bias network. Like amplifier 500 (FIG. 5A), amplifier 800 is a complementary input, self-biased differential amplifier with gain compensation. Amplifier 800 can be used in many applications, one of which being the data receiver shown in FIG. 6.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A complementary input self-biased differential amplifier comprising:
    a differential input stage having at least one input transistor;
    a gain compensation device having a gain compensation transistor coupled in parallel with the at least one input transistor, wherein the gain compensation transistor is coupled to a self-bias node within the self-biased differential amplifier; and
    a current source transistor coupled to the differential input stage, the current source transistor having a gate coupled to the self-bias node.

2. The complementary input self-biased differential amplifier of claim 1 further comprising a second differential input stage and a second gain compensation device configured to be responsive to a bias voltage on the self-bias node.

3. The complementary input self-biased differential amplifier of claim 1 wherein the differential input stage includes first and second output nodes, the first output node being coupled within the amplifier to influence a voltage on the self-bias node.

4. The complementary input self-biased differential amplifier of claim 3 further comprising a second differential input stage that includes third and fourth output nodes, the third output node being coupled within the amplifier to influence the voltage on the self-bias node.

5. The complementary input self-biased differential amplifier of claim 4 further comprising an impedance transforming circuit coupled between the first and third output nodes.

6. The complementary input self-biased differential amplifier of claim 4 further comprising a pair of cascode connected transistors in series between the first and third output nodes, wherein the self-bias node is formed at a junction between the pair of cascode connected transistors.

7. A complementary input self-biased differential amplifier comprising:
    a first differential amplifier having an N-channel input transistor pair, a P-channel load transistor pair, and a first current source, the N-channel input transistor pair being coupled to a differential input node, and the first current source having a bias input node coupled to a self-bias node;
    a second differential amplifier having a P-channel input transistor pair, an N-channel load transistor pair, and a second current source, the P-channel input transistor pair being coupled to the differential input node in parallel with the N-channel input transistor pair, and the second current source having a bias input node coupled to the self-bias node; and
    a gain compensation transistor pair having gates coupled to the self-bias node;
    wherein the gain compensation transistor pair comprises a pair of N-channel transistors, each having a source and drain coupled in parallel with a source and drain of a corresponding one of the N-channel input transistor pair.

8. The complementary input self-biased differential amplifier of claim 7 further including a second gain compensation transistor pair comprising a pair of P-channel transistors, each having a source and drain coupled in parallel with a source and drain of a corresponding one of the P-channel input transistor pair, and having gates coupled to the self-bias node.

9. The complementary input self-biased differential amplifier of claim 7 wherein a differential amplifier output node is formed at each junction between an input transistor and a load transistor, such that the first differential amplifier has first and second output nodes, and the second differential amplifier has first and second output nodes, the self-biased differential amplifier further comprising:
    a first pair of series connected transistors coupled between the first output nodes of the first and second differential amplifiers, the self-bias node being formed by a junction between the first pair of series connected transistors; and
    a second pair of series connected transistors coupled between the second output nodes of the first and second differential amplifiers, an amplifier output node being formed by the junction between the second pair of series connected transistors.

10. The complementary input self-biased differential amplifier of claim 7 further comprising:
    an N-channel select transistor pair, each coupled in series with a corresponding transistor of the N-channel input transistor pair; and
    a P-channel select transistor pair, each coupled in series with a corresponding transistor of the P-channel input transistor pair.

11. A complementary input self-biased differential amplifier comprising:
    an N-channel differential input transistor stage configured to be responsive to an input signal on an input node and a reference signal on a reference node, the N-channel differential input transistor stage being coupled between a first current source and a pair of P-channel load transistors;
    a P-channel differential input transistor stage configured to be responsive to the input signal on the input node and the reference signal on the reference node, the P-channel differential input transistor stage being coupled between a second current source and a pair of N-channel load transistors;
    a differential output comprising a first node fed back into the self-biased differential amplifier as a self-bias node, and all amplifier output node configured to drive a load external to the self-biased differential amplifier;

at least one gain compensating transistor having a gate coupled to the self-bias node, and a source and drain coupled in parallel with one of the differential input transistor stages;

a first pair of series connected transistors coupled between a first transistor of the pair of P-channel load transistors and a first transistor of the pair of N-channel load transistors, a junction formed between the first pair of series connected transistors being the self-bias node; and a second pair of series connected transistors coupled between a second transistor of the pair of P-channel load transistors and a second transistor of the pair of N-channel load transistors, a junction formed between the second pair of series connected transistors being the amplifier output node.

12. The complementary input self-biased differential amplifier of claim 11 wherein the N-channel differential input transistor stage comprises:

a first N-channel input transistor coupled between the first current source and one of the P-channel load transistors, the first N-channel input transistor having a gate coupled to the input node; and a second N-channel input transistor coupled between the first current source and another of the P-channel load transistors, the second N-channel input transistor having a gate coupled to the reference node.

13. The complementary input self-biased differential amplifier of claim 12 wherein the P-channel differential input transistor stage comprises:

a first P-channel input transistor coupled between the second current source and one of the N-channel load transistors, the first P-channel input transistor having a gate coupled to the input node; and a second P-channel input transistor coupled between the second current source and another of the N-channel load transistors, the second P-channel input transistor having a gate coupled to the reference node.

14. The complementary input self-biased differential amplifier of claim 13 wherein the at least one gain compensating transistor comprises:

a pair of N-channel transistors, each being coupled in parallel with a corresponding one of the N-channel input transistors; and a pair of P-channel transistors, each being coupled in parallel with a corresponding one of the P-channel input transistors.

15. The complementary input self-biased differential amplifier of claim 10 wherein the P-channel differential input stage comprises:

a first P-channel input transistor and a first P-channel select transistor coupled in series between the second current source and a first transistor of the pair of N-channel load transistors, the first P-channel input transistor having a gate coupled to the reference node;

a second P-channel input transistor and a second P-channel select transistor coupled in series between the second current source and the first transistor of the pair of N-channel load transistors, the second P-channel input transistor having a gate coupled to a second reference node; and a third P-channel input transistor coupled between the second current source and a second of the pair of N-channel load transistors, the third P-channel input transistor having a gate coupled to the input node.

16. The complementary input self-biased differential amplifier of claim 15 wherein the N-channel differential input stage comprises:

a first N-channel input transistor and a first N-channel select transistor coupled in series between the first current source and a first transistor of the pair of P-channel load transistors, the first N-channel input transistor having a gate coupled to the reference node;

a second N-channel input transistor and a second N-channel select transistor coupled in series between the first current source and the first transistor of the pair of P-channel load transistors, the second N-channel input transistor having a gate coupled to the second reference node; and a third N-channel input transistor coupled between the first current source and a second transistor of the pair of P-channel load transistors, the third N-channel input transistor having a gate coupled to the input node.

17. The complementary input self-biased differential amplifier of claim 16 further comprising:

a third N-channel select transistor coupled in series with the third N-channel input transistor between the first current source and the second transistor of the pair of P-channel load transistors, the third N-channel select transistor being configured to always be on.

18. The complementary input self-biased differential amplifier of claim 17 further comprising:

a fourth N-channel input transistor and a fourth N-channel select transistor coupled in series between the first current source and the second transistor of the pair of P-channel load transistors, the fourth N-channel input transistor having a gate coupled to the input node, and the fourth N-channel select transistor being configured to always be off.

19. A complementary input self-biased differential amplifier comprising:

a first differential amplifier having differential input nodes and differential output nodes, the differential input nodes being coupled to a first differential pair of transistors;

a second differential amplifier having differential input nodes in common with the first differential amplifier, and having differential output nodes, the differential input nodes being coupled to a second differential pair of transistors;

a plurality of output impedance increasing transistors coupled between the differential output nodes of the first differential amplifier and the differential output nodes of the second differential amplifier to create a bias node and an amplifier output node; and at least one gain compensating transistor coupled in parallel to one transistor of the first differential pair of transistors, the at least one gain compensating transistor having a gate coupled to the bias node;

wherein the first differential pair of transistors comprises;

a first reference input transistor;

a first select transistor in series with the first reference input transistor, the first select transistors having a gate coupled to a first control node;

a second reference input transistor; and a second select transistor in series with the second reference input transistor, the second select transistor having a gate coupled to a second control node, such that when signals on the first and second control nodes have opposite polarity, one of the first and second select transistors is on, and the other is off.

20. The complementary input self-biased differential amplifier of claim 19 wherein the first differential pair of transistors further comprises:

a first data input transistor;

a third s elect transistor in series with the first data input transistor, the third select transistor having a gate coupled to a reference node such that the third select transistor is always on;

a second data input transistor; and a fourth select transistor in series with the second data input transistor, the fourth select transistor having a gate coupled to a second reference node such that the fourth select transistor is always off.

* * * * *

UNITED STATES PATENT AND TRADEMARK OFFICE
CERTIFICATE OF CORRECTION

PATENT NO. : 6,304,141
DATED : October 16, 2001
INVENTOR(S) : Kennedy et al.

It is certified that error appears in the above-identified patent and that said Letters Patent is hereby corrected as shown below:

Column 10, claim 11,
Line 66, delete "all" and insert -- an --, therefor.

Column 13, claim 20,
Line 5, delete "s elect" and insert -- select --, therefor.

Signed and Sealed this

Twenty-sixth Day of March, 2002

Attest:

JAMES E. ROGAN
Attesting Officer        Director of the United States Patent and Trademark Office